United States Patent
Ajmera et al.

(10) Patent No.: US 6,521,947 B1
(45) Date of Patent: *Feb. 18, 2003

(54) METHOD OF INTEGRATING SUBSTRATE CONTACT ON SOI WAFERS WITH STI PROCESS

(75) Inventors: Atul Ajmera, Wappingers Falls, NY (US); Effendi Leobandung, Wappingers Falls, NY (US); Werner Rausch, Stormville, NY (US); Dominic J. Schepis, Wappingers Falls, NY (US); Ghavam G. Shahidi, Elmsford, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/239,327

(22) Filed: Jan. 28, 1999

(51) Int. Cl.⁷ .............................................. H01L 27/01
(52) U.S. Cl. ...................................... 257/347; 257/508
(58) Field of Search ................................. 257/349, 347, 257/350, 503, 621, 901, 413, 755, 508

(56) References Cited

U.S. PATENT DOCUMENTS

| | | | |
|---|---|---|---|
| 4,128,670 A | * 12/1978 | Gaensslen | 257/413 |
| 4,716,128 A | 12/1987 | Schubert et al. | 438/294 |
| 4,763,183 A | 8/1988 | Ng et al. | 257/288 |
| 5,113,236 A | 5/1992 | Arnold et al. | 257/347 |
| 5,185,535 A | 2/1993 | Farb et al. | 257/351 |
| 5,241,211 A | 8/1993 | Tashiro | 257/506 |
| 5,314,841 A | 5/1994 | Brady et al. | 437/203 |
| 5,488,243 A | 1/1996 | Tsuruta et al. | 257/314 |
| 5,489,792 A | 2/1996 | Hu et al. | 257/347 |
| 5,621,239 A | 4/1997 | Horie et al. | 257/499 |
| 5,641,980 A | * 6/1997 | Yamaguchi et al. | 257/349 |
| 5,643,823 A | 7/1997 | Ho et al. | 437/67 |
| 5,646,053 A | 7/1997 | Schepis et al. | 437/10 |
| 5,646,432 A | 7/1997 | Iwaki et al. | 257/347 |
| 5,702,957 A | 12/1997 | Padmanabhan | 438/262 |
| 5,742,075 A | 4/1998 | Burns et al. | 257/59 |
| 5,747,866 A | 5/1998 | Ho et al. | 257/506 |
| 5,856,706 A | 1/1999 | Lee | 257/758 |
| 5,929,488 A | * 7/1999 | Endou | 257/347 |
| 5,945,712 A | * 8/1999 | Kim | 257/348 |
| 6,300,666 B1 | * 10/2001 | Fechner et al. | 257/621 |

FOREIGN PATENT DOCUMENTS

| | | | |
|---|---|---|---|
| JP | 3119764 | * 5/1991 | 257/349 |
| JP | 04-102319 | 4/1992 | |
| JP | 04-343265 | 11/1992 | |
| JP | 05-006997 | 1/1993 | |
| JP | 05-055521 | 3/1993 | |
| JP | 07-014800 | 1/1995 | |
| JP | 08-018009 | 1/1996 | |
| JP | 09-162417 | 6/1997 | |
| JP | 09-270492 | 10/1997 | |
| JP | 09-283751 | 10/1997 | |
| JP | 200-196102 | 10/1997 | |
| JP | 10-321868 | 12/1998 | |

* cited by examiner

*Primary Examiner*—Mark V. Prenty
(74) *Attorney, Agent, or Firm*—Connolly Bove Lodge & Hutz LLP; Joseph P. Abate

(57) ABSTRACT

A method for forming a substrate contact in a substrate that includes a silicon on insulator region. A shallow isolation trench is formed in the silicon on insulator substrate. The shallow isolation trench is filled. Photoresist is deposited on the substrate. A contact trench is formed in the substrate through the filled shallow isolation trench, silicon on insulator, and silicon substrate underlying the silicon on insulator region. The contact trench is filled, wherein the material filling the contact trench forms a contact to the silicon substrate.

16 Claims, 5 Drawing Sheets

US 6,521,947 B1

METHOD OF INTEGRATING SUBSTRATE CONTACT ON SOI WAFERS WITH STI PROCESS

FIELD OF THE INVENTION

The present invention relates to silicon-on-insulator (SOI) semiconductor devices and a method for forming a structure for contacting a portion of the substrate underlying the silicon on insulator region of the substrate. The present invention also includes semiconductor devices formed according to this process.

BACKGROUND OF THE INVENTION

Semiconductor devices including a silicon on insulator substrate structure include a wafer that has a buried layer of oxide that isolates the top layer of silicon, where the active devices are formed, from the substrate. Hence the term silicon on insulator (SOI). Because the portion of the substrate underlying the oxide layer typically is not electrically connected to any other structure, in other words the underlying substrate is floating, static charges can build up in the substrate during normal chip operation. Such static build ups can cause a back channel of the SOI devices to turn on, which can disturb normal operation of the chips. Impact of build up of static charges can include an increase of standby current of the chips, chip thermal runaway, and even malfunction of the logic and SRAM circuits.

To solve this problem, contact has been made to the portion of the substrate underlying the insulator portion of the silicon-on-insulator substrate structure so as to ground it. At the present time, substrate contact typically is created by wire bonding to the back side of a chip at the packaging level. However, such methods can require extra steps and materials. For example, wire bonding to the back of a chip is expensive because it has to be performed on individual chips one by one. Wire bonding may also require alteration of standard packaging methods.

SUMMARY OF THE INVENTION

The present invention provides a method for forming contacts to a substrate region underlying the insulator portion of a silicon on insulator substrate that may be carried during normal processing operations for forming the chip.

In accordance with these and other objects and advantages, aspects of the present invention provide a method for forming a substrate contact and a substrate that includes a silicon on insulator region. The method includes forming a shallow isolation trench in the silicon on insulator substrate region. The shallow isolation trench is filled. Photoresist is deposited on the substrate. The method also includes forming a contact trench in the substrate through the filled shallow isolation trench and silicon on insulator substrate region extending down at least to the top of a silicon substrate underlying the silicon on insulator region. The contact trench is filled, wherein the material filling the contact trench forms a contact to the silicon substrate.

According to other aspects, the present invention also provides a semiconductor device structure. The device structure includes a substrate including a silicon on insulator substrate region. A shallow trench isolation region is arranged in the substrate. The device also includes a contact trench extends through the shallow trench in the isolation region to a silicon portion of the substrate underlying the silicon on insulator region. The contact trench forms a contact to an underlying silicon portion of the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIGS. 2–10 represent cross-sectional views an embodiment of a semiconductor device at various stages of an embodiment of a process for forming a semiconductor device according to the present invention, wherein FIG. 10 represents a final form of the embodiment;

DETAILED DESCRIPTION OF THE INVENTION

As described above, the present invention provides a contact to a substrate portion underlying a silicon on insulator substrate structure and a method for forming the contact. The present invention provides a relatively easily manufacturable and cost effective method for making the substrate contact. Among the advantages of the present invention is that the process may be integrated with current processes typically utilized for forming shallow trench isolation regions. The present invention may be integrated with current manufacturing processes without impacting the yield of the processes. Among other functions, a contact according to the present invention may act as a via for a substrate contact.

Figure 1:
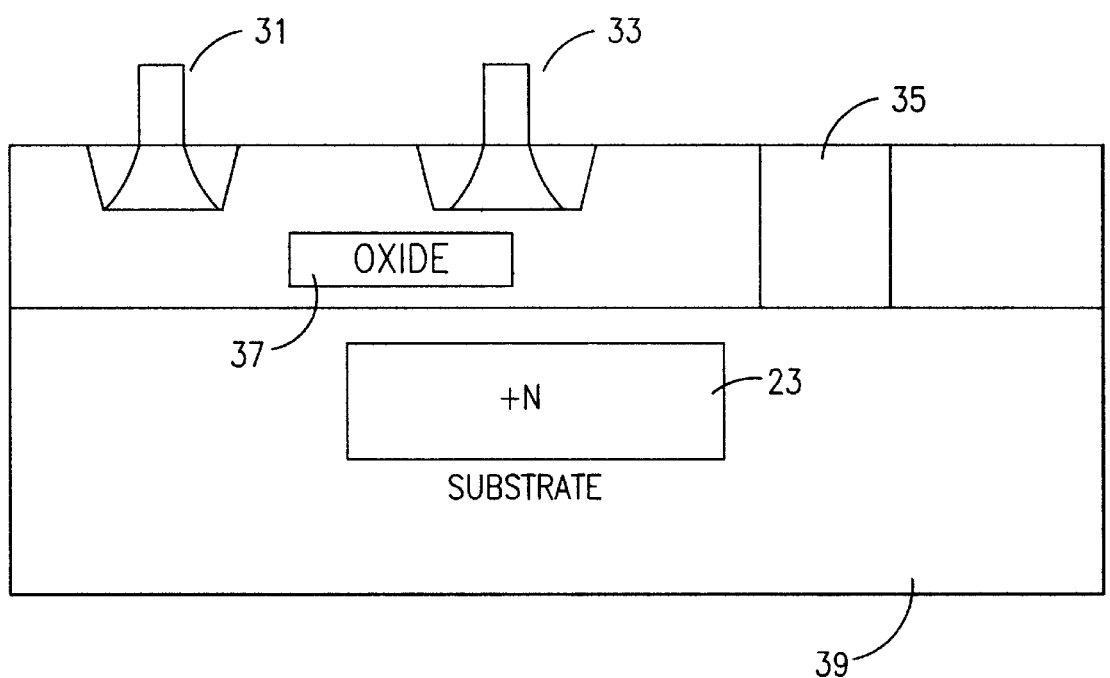
FIG. 1 represents a cross-sectional view of an embodiment of a semiconductor device according to the present invention.

FIG. 1 illustrates an embodiment of a structure according to the present invention. The embodiment illustrated in FIG. 1 includes two devices 31 and 33 and a substrate contact 35. Oxide region 37 underlies device 33. Substrate 39 includes n+ region 23.

According to the methods of the present invention, a substrate including a silicon on insulator region is provided. As stated above, the process of the present invention may be integrated with the process of forming a shallow trench isolation region in the substrate. Accordingly, FIG. 2 illustrates a substrate 1 that includes the underlying substrate 3.

On top of the substrate 3 the insulator region 5 has been formed. In the case of a silicon substrate, the insulator portion of the silicon on insulator structure is an oxidized portion of the silicon substrate. A layer of silicon 7 overlies the oxide or insulator portion of the substrate 5.

Figure 2:
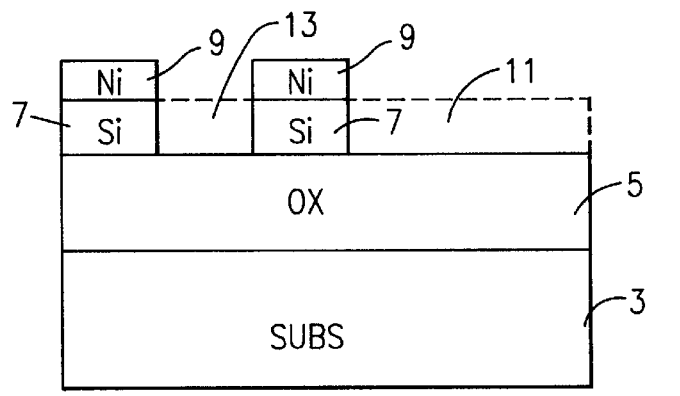
Figure 3:
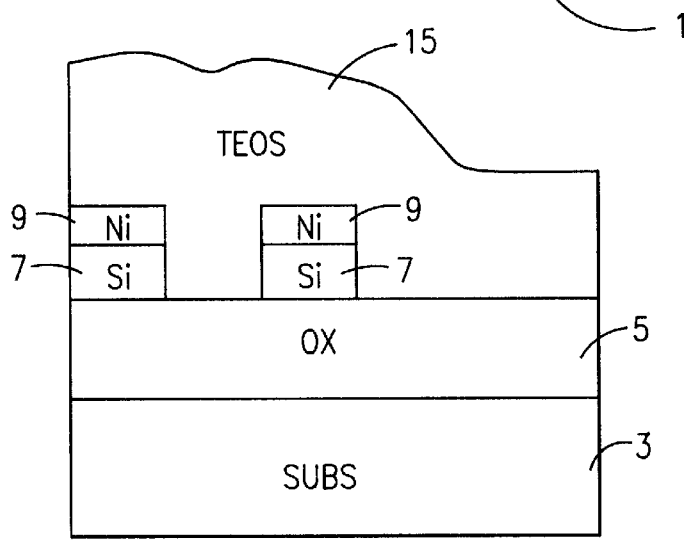

In the embodiment illustrated in FIG. 2, the silicon layer 7 has been patterned as part of the process for forming the shallow trench isolation region. Nitride layer 9 overlies silicon layer 7. Both nitride layer 9 and silicon layer 7 are deposited as blanket layers and patterned together. The nitride may be used as CMP stop layer. The broken lines in FIG. 2 illustrate the etched-away portions of the silicon layer.

After etching of the shallow trench to form the structure illustrated in FIG. 2, a material may be deposited in the regions etched to create the structure illustrated in FIG. 2 as well as on other exposed portions of the top surface of the substrate. Typically, the material deposited in the shallow isolation trench and other portions of the substrate is an electrically insulating material. One example of such an electrically insulating material is tetraethylorthosilicate (TEOS).

Figure 4:
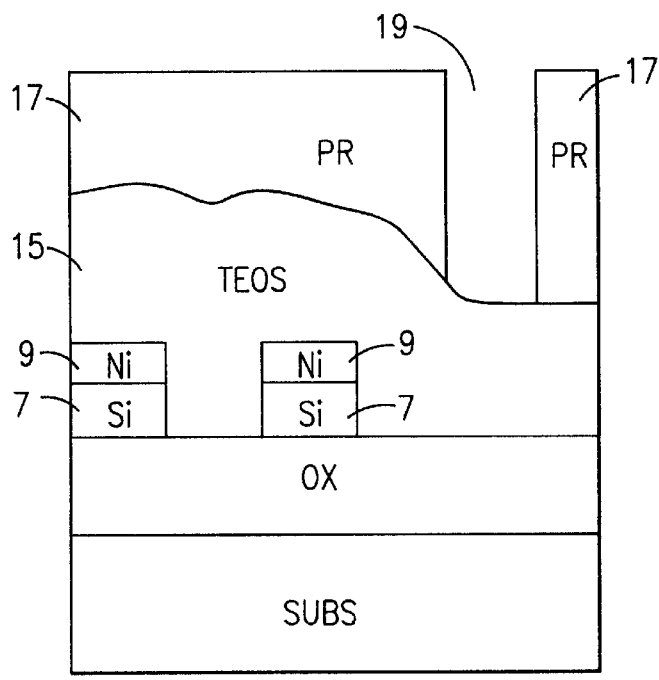

After depositing the electrically insulating material, which forms the fill of the shallow isolation trench, a trench may be etched through the shallow isolation trench fill as well as the underlying insulator of the silicon on insulator substrate structure. One method for forming the contact trench is to deposit a layer of photoresist 17 on the electrically insulating material 15 filling the shallow isolation trench and covering portions of the substrate. As illustrated in FIG. 4, the photoresist may be exposed and developed, resulting in formation of a mask with an opening 19 for etching the contact trench.

Figure 11:
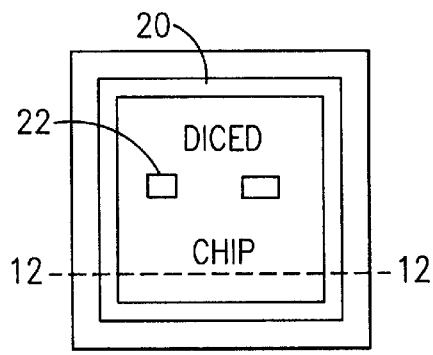
FIG. 11 represents an overhead view of another embodiment of a structure according to the present invention.
Figure 12:
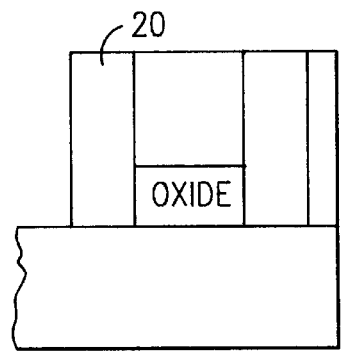
FIG. 12 represents a cross-sectional view of the embodiment illustrated in FIG. 11, taken along the line 12—12.

The pattern formed in the photoresist for etching the contact trench depends upon the form that it is desired that the contact trench have. According to one embodiment, a ring is patterned in the photoresist around the chip in the field area of the chip, as illustrated in FIGS. 11 and 12, as represented by 20. Alternatively, the contact structure may have other configurations. For example, contact may be made inside the chip represented by 22, as also illustrated in FIG. 11. However, the ring configuration may also shield the chip from contamination after dicing.

After patterning the photoresist, the contact trench may be etched. The photoresist may be utilized as a mask to etch the contact trench while masking the shallow isolation trenches to form a conductive contact. Any suitable process may be utilized for etching the contact trench. According to one embodiment, reactive ion etching (RIE) is utilized to form the contact trench. By etching the contact trench after deposition of the electrically insulating in the shallow isolation trench, an oxide RIE process can be utilized as opposed to utilizing a silicon RIE and then an oxide RIE.

Figure 5:
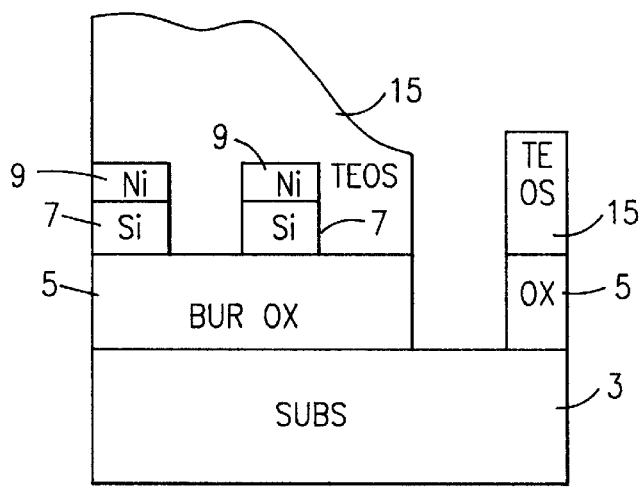

FIG. 5 illustrates an embodiment of a contact trench that has been etched through the electrical insulator filling the shallow isolation trench as well as through the buried oxide layer of the silicon on insulator substrate region. FIG. 5 illustrates the structure after etching of the trench and stripping of the photoresist. As can be seen in FIG. 5, at least a portion of the underlying substrate 3 is exposed by etching of the contact trench.

According to some embodiments, the contact trench may at least partially extend into the underlying substrate region 3. The dimensions of the contact trench may be determined by a desired operational characteristics of the trench. For example, the contact trench may be formed sufficiently wide so as to act as a guard structure to prevent diffusion of dopants through the insulator region of the silicon on insulator region of the substrate. According to one embodiment, the contact trench in the form of a ring has a width of about 0.5 $\mu$m.

Where the contact trench is etched as a ring in the substrate, the contact trench may act as a guard ring. The contact structure may extend to the surface of a layer overlying a substrate, to the top of the substrate, or into the substrate.

In some embodiments, in order to enhance substrate contact, at least one dopant may be implanted into the silicon substrate exposed by etching of the contact trench. According to one embodiment, boron may be implanted into the exposed silicon substrate. Other dopants that may be utilized include arsenic, phosphorus, and/or indium. The dopant dosage may be heavy. For example, the dopant dosage could be about $1 \times 10^{15}$ cm$^{-2}$.

The contact trench may then be filled with a desired material. So that the filled contact trench forms an electrical contact to the underlying substrate, the material filling the contact trench may be electrically conducting material. Alternatively, a material that may be treated to become electrically conducting may be utilized to fill the contact trench. The contact trench may be formed and filled with undoped polycrystalline silicon simultaneously with forming and filling trenches forming the shallow isolation regions between devices.

According to one embodiment, undoped polycrystalline silicon may be deposited in the contact trench. As stated above, the present invention may fit in with existing processes. Along these lines, according to standard practices for forming the shallow isolation trench, undoped polycrystalline silicon may be deposited for the purposes of planarizing the shallow isolation trench. Therefore, by filling the contact trench with undoped polycrystalline silicon, no new steps are introduced by filling the contact trench with undoped polycrystalline silicon.

If the contact trench is in a form of a ring about a portion of the substrate, after depositing the undoped polycrystalline silicon, a ring of polycrystalline silicon may exist about an area of the substrate. This ring or other filled trench structure may be utilized to make a substrate contact.

Figure 6:
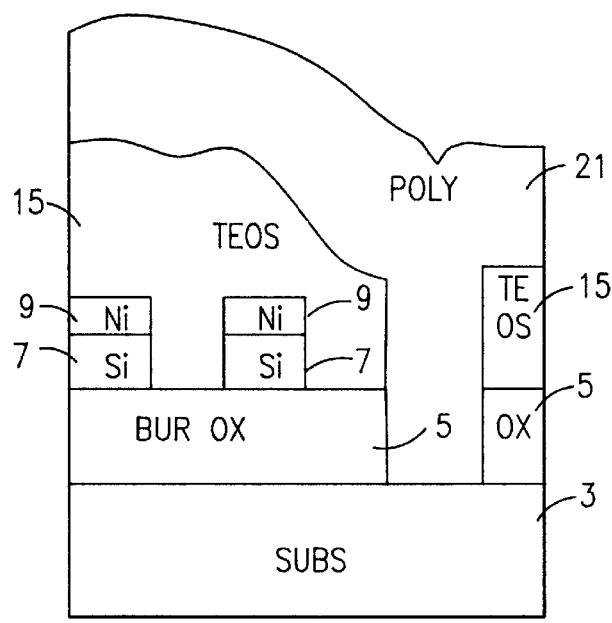

FIG. 6 illustrates an example of a structure according to the present invention wherein the contact trench has been filled with polycrystalline silicon. The undoped polycrystalline silicon has also been deposited on other surfaces of the substrate.

Figure 7:
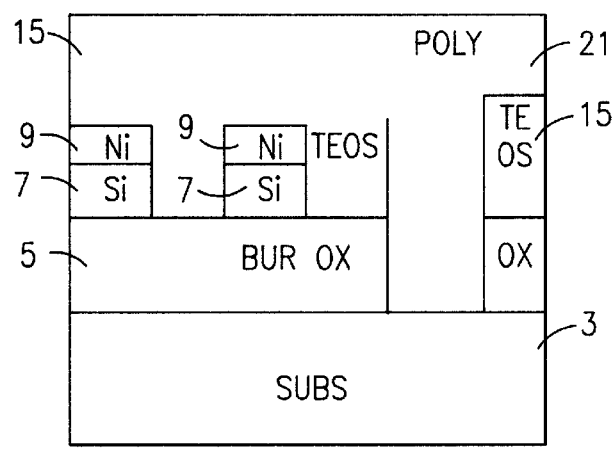

After this point in the process illustrated in FIGS. 2–10, the steps carried out may be basically identical to process steps normally carried out in the shallow trench isolation processing. After depositing the polycrystalline silicon 21, the structure may be planarized. This includes planarizing the electrically insulating material forming the shallow trench isolation region as well as the undoped polycrystalline silicon. The undoped polycrystalline silicon and electrically insulating material filling the shallow isolation trench may be planarized utilizing chemical mechanical polishing (CMP). FIG. 7 illustrates the structure after planarization of the polycrystalline silicon 21 and the electrically insulating material 15 filling the shallow isolation trench.

The polycrystalline silicon filling the contact trench may be treated as any active silicon area. Accordingly, the undoped polycrystalline silicon filling the contact trench may be subject to a p+ diffusion implant. The polycrystalline silicon filling the contact trench may also be silicided.

Figure 8:
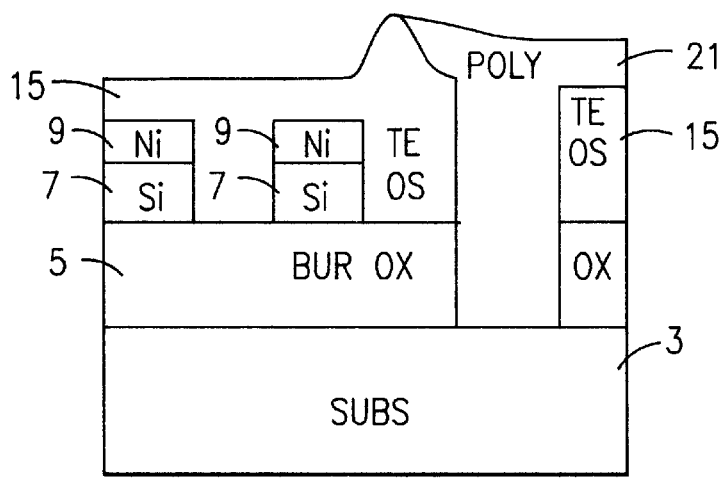

After planarization of the polycrystalline silicon and electrically insulating material filling the shallow isolation trench, the structure may be subjected to a reactive ion etch. FIG. 8 illustrates the resulting structure. The purpose of step(s) resulting in the structure represented in FIG. 8 is to etch the oxide 15 down in the area(s) not covered by polycrystalline silicon so it becomes planar with the oxide 21 below the poly. The polycrystalline silicon acts like a mask during this etch.

Figure 9:
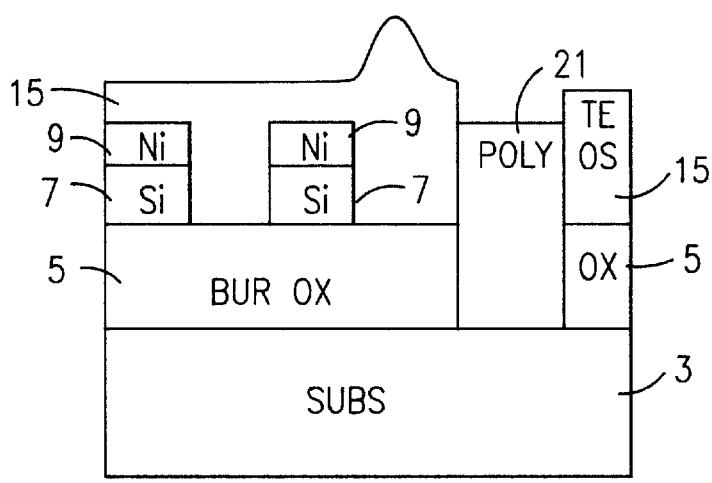
Figure 10:
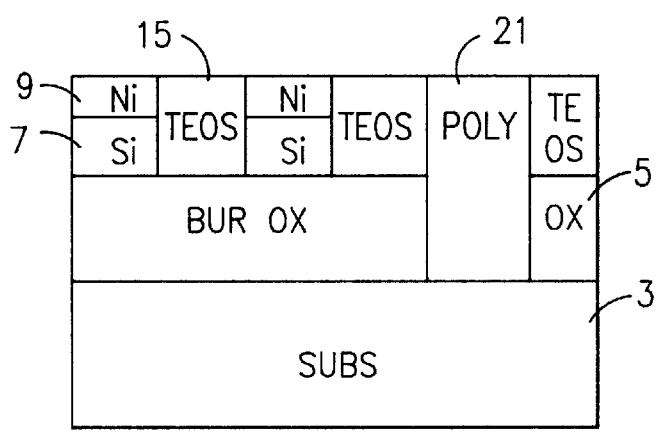

FIG. 9 shows the polycrystalline silicon mask being etched away/recessed so it is slightly below oxide TEOS 15 level. At this point all oxide 21 is sufficiently planar so that a CMP step can be used to further planarized it down to nitride level as shown in FIG. 10.

After doping of the filled contact trench with dopant, such as arsenic and phosphorus for the contact to an n-type substrate and boron and indium for contact to a p-type substrate, and also silicidation, the substrate contact may be landed to connect and ground the substrate. Doping and silicidation processes typically are part of normal processing for a chip. According to one embodiment, the middle contact (MC) is landed to the polycrystalline silicon filling the contact trench to connect and ground the substrate.

The contact of the present invention may be landed by depositing at least one electrically conducting material on at least one portion of the filled contact trench. The at least one electrically conducting material may include at least one metal and/or alloy. Other material(s) that can be used to fill the contact may include tungsten, in which case the substrate contact etch step can be done after all device formation, such as NFET and PFET, and insulating material has been deposited and planarized for middle contact insulator but before middle contact etch.

Because of the simplicity of the process of the present invention, it can provide very good ohmic contact to the substrate without any potential yield degradation to the chip. According to some applications, it may be desirable to locally bias the substrate in order to modify and enhance the performance of the SOI device on top of the substrate. According to such embodiments, an island of wells may be required in the substrate to isolate them from each other. The present invention may be easily combined with such structures because the structure of the present invention requires minimal area and can be integrated easily into any part of the circuit in the chip.

Figure 13:
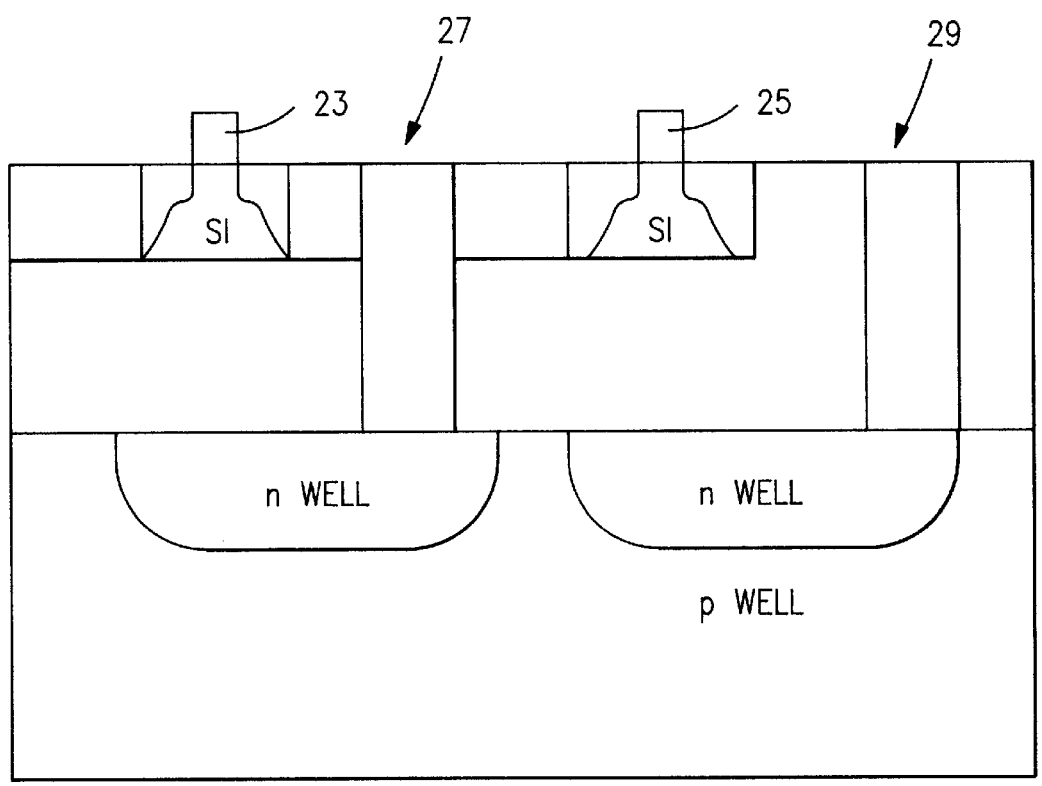
FIG. 13 represents a cross-sectional view of an embodiment of the present invention that includes an island of wells.

FIG. 13 illustrates an example of an embodiment of the present invention that includes an island of wells. The embodiment illustrated in FIG. 13 includes two devices 23 and 25, each having an associated substrate contact 27 and 29. An n well is associated with device 27 and an n well and a p well are associated with contact 29.

As stated above, the present invention also includes a semiconductor device. The semiconductor device includes a substrate including a silicon on insulator substrate region. The semiconductor device structure also includes at least one shallow trench isolation region on the substrate. A contact trench extends through at least a portion of a shallow trench isolation region to a silicon portion of the substrate underlying the silicon on insulator region. The contact trench forms a contact to the underlying silicon portion of the substrate.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A semiconductor device structure, comprising:
   a substrate including a silicon-on-insulator substrate region;
   at least one shallow trench isolation region on the substrate; and
   a contact trench extending through the shallow trench isolation region to a silicon portion of the substrate underlying the silicon-on-insulator region and forming a contact to the underlying silicon portion of the substrate, said underlying portion including at least one well region in the substrate contacting said contact, wherein said contact trench is filled with polycrystalline silicon, where said polysilicon is doped to be electrically conductive, and wherein said polycrystalline silicon is silicided.

2. The semiconductor device according to claim 1, wherein the shallow trench isolation region is filled with an electrically insulating material.

3. The semiconductor device according to claim 2, wherein the electrically insulating material is tetraethylorthosilicate oxide.

4. The semiconductor device according to claim 1, wherein the contact trench extends around the substrate in a field area of the substrate.

5. The semiconductor device according to claim 1, wherein the contact trench is sufficiently wide to act as a guard structure to prevent diffusion of dopants through the insulator region of the silicon on insulator region of the substrate.

6. The semiconductor device according to claim 1, wherein at least one dopant is implanted into the silicon substrate underlying the contact trench.

7. The semiconductor device according to claim 6, wherein the at least one dopant includes boron, phosphorus, arsenic, indium, or antimony.

8. The semiconductor device according to claim 1, wherein said polycrystalline silicon is p+ doped or n+ doped.

9. The semiconductor device according to claim 1, further comprising:
   a contact of an electrically conducting material electrically connected to the contact trench.

10. The semiconductor device according to claim 9, wherein said contact includes at least one metal.

11. The semiconductor device according to claim 1, wherein the substrate is biased.

12. The semiconductor device according to claim 1, wherein said at least one well is an n-well.

13. The semiconductor device according to claim 1, wherein said contact trench is filled with electrically conducting material.

14. The semiconductor device according to claim 13, wherein the well regions include an n-well.

15. The semiconductor device according to claim 1, wherein said at least one well comprises a plurality of isolated wells in said substrate.

16. The semiconductor device according to claim 1, wherein said at least one well is a p-well.

* * * * *